(12) United States Patent
Atarius et al.

(10) Patent No.: US 6,226,336 B1
(45) Date of Patent: May 1, 2001

(54) METHOD AND APPARATUS FOR DETECTING A FREQUENCY SYNCHRONIZATION SIGNAL

(75) Inventors: Roozbeh Atarius, Musikantvägen; Berthold Gustafsson Kjell, Borgåslingan, both of (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/026,724

(22) Filed: Feb. 20, 1998

(51) Int. Cl.[7] ................................................ H04L 7/00
(52) U.S. Cl. ............................................ 375/364; 375/343
(58) Field of Search ................................. 375/208, 210, 375/340, 343, 354, 364, 361, 363, 362; 370/503, 514, 515

(56) References Cited

U.S. PATENT DOCUMENTS

| | | | |
|---|---|---|---|
| 4,847,872 | * 7/1989 | Hespelt et al. | 375/346 |
| 5,090,028 | * 2/1992 | Crebouw | 375/354 |
| 5,121,414 | * 6/1992 | Levine et al. | 375/340 |
| 5,177,740 | * 1/1993 | Toy et al. | 375/368 |
| 5,187,719 | * 2/1993 | Birgenheier et al. | 375/343 |
| 5,195,106 | * 3/1993 | Kazecki et al. | 375/232 |
| 5,267,264 | 11/1993 | Shlenker et al. | 375/343 |
| 5,276,706 | 1/1994 | Critchlow | 375/343 |
| 5,293,398 | 3/1994 | Hamao et al. | 375/343 |
| 5,305,347 | * 4/1994 | Roschmann et al. | 375/130 |
| 5,402,450 | 3/1995 | Lennen | 375/368 |
| 5,455,845 | 10/1995 | Sullivan | 375/317 |
| 5,465,276 | 11/1995 | Larsson et al. | 375/348 |
| 5,590,160 | * 12/1996 | Ostman | 370/515 |
| 5,596,582 | * 1/1997 | Sato et al. | 370/514 |
| 5,623,511 | * 4/1997 | Bar-David et al. | 375/207 |
| 5,654,982 | * 8/1997 | Goodson et al. | 375/222 |
| 5,774,494 | * 6/1998 | Sawahashi et al. | 375/207 |
| 5,812,523 | * 9/1998 | Isaksson et al. | 375/362 |
| 6,016,329 | * 1/2000 | Iwasaki | 375/340 |

FOREIGN PATENT DOCUMENTS

| | | |
|---|---|---|
| 718 971 | 6/1996 | (EP) . |
| 2 300 093 | 10/1996 | (GB) . |
| 2300093 | 10/1996 | (GB) . |

OTHER PUBLICATIONS

European Digital Cellular Telecommunications System (Phase2): Modulation (GSM 05.04), European Telecommunications Standards Institute, pp. 5–10, Oct. 1993.

European Digital Cellular Telecommunication System (Phase 2): Radio Transmission and Reception (GSM 05.05), European Telecommunications Standards Institute, pp. 5–44, Aug. 1995.

Fjelner, C. and Swärd E., "Implementation of Digital Frequency Correction Burst Detector with Filed Programmable Gate Arays", M. Sc. Thesis, Apr. 29, 1994.

\* cited by examiner

*Primary Examiner*—Tesfaldet Bocure
(74) *Attorney, Agent, or Firm*—Burns, Doane, Swecker & Mathis, L.L.P.

(57) ABSTRACT

In a communication system including at least one transmitter and at least one receiver, a frequency synchronization signal transmitted from the transmitter to the receiver is detected. An in-phase component of a signal received by the receiver is delayed, and the delayed in-phase component is multiplied by a quadrature component of the received signal. The steps of delaying and multiplying are repeated for a predetermined number of samples of the received signal to produce an estimated cross-correlation value. A determination is made whether the estimated cross-correlation value is at least as great as a predetermined threshold, indicating that the transmitted signal is a frequency synchronization signal.

14 Claims, 8 Drawing Sheets

METHOD AND APPARATUS FOR DETECTING A FREQUENCY SYNCHRONIZATION SIGNAL

BACKGROUND

This invention relates generally to a method and apparatus for detecting a frequency synchronization signal. More particularly, this invention relates to a method and apparatus for detecting a frequency synchronization signal transmitted from a transmitter and received by a receiver in a communication system.

In any communication system, it is important for a receiver to be synchronized with a transmitter so that messages can be successfully exchanged between the transmitter and the receiver. In a radio communication system, in particular, it is important that a receiver be tuned to the frequency of the transmitter for optimal reception.

In a typical radio communication system, remote stations communicate with one or more base stations via a radio air interface. Various approaches have been employed to prevent transmissions between the various base stations and remote stations from interfering with each other.

In some radio communication systems, neighboring base stations are each assigned a different carrier frequency with which to communicate with remote stations so that transmissions from one base station do not interfere with transmissions from a neighboring base station. In addition to such a Frequency Division Multiple Access (FDMA) technique, Time Division Multiple Access (TDMA) has been employed. In systems using TDMA, a base station may allocate a particular time slot or slots within a frame on a carrier to each remote station. Some remote stations can use the same carrier frequency but different time slots to communicate with the base station.

In other radio communication systems, the Code Division Multiple Access (CDMA) method has been employed. According to the CDMA method, each remote station is assigned a particular digital code word(s) that is orthogonal to code words assigned to other stations. Neighboring base stations can exchange messages with remote stations using the same frequency but different digital orthogonal code words to indicate which remote station the messages are designated for.

Whether a radio communication system employs FDMA, TDMA, CDMA, a combination of these approaches, or some other approach, it is important for a remote station to be time and frequency synchronized to the base station serving the area from which it desires to communicate. In other words, the local frequency reference of the remote station must be tuned to the carrier frequency of the base station, and the local time reference of the remote station must be synchronized to the time reference of the base station. A periodic synchronization signal is typically transmitted from the base station to the remote station for this purpose.

In a system complying with the European Global System for Mobile Communication (GSM) standard, information is transmitted from the base station to a remote station by modulating the carrier of the base station with, e.g., a Normal Burst (NB) of data. To synchronize the mobile station to the base station, the carrier of the base station is also modulated from time to time with a Frequency Correction Burst (FCB) and a Synchronization Burst (SB) to form a frequency synchronization signal.

The carrier of the base station is typically modulated with the FCB using Gaussian Minimum Shift Keying (GMSK). In a GSM system, a FCB is a sequence of 148 symbols, each symbol a zero, that transforms into a pure sinusoidal signal after modulation. The frequency of the resulting frequency synchronization signal is thus equal to $\frac{1}{4}$ T Hz, where T represents a symbol duration. T is typically $\frac{48}{13}$ microseconds ($\mu s$), so that the frequency synchronization signal has a frequency of approximately 67.7 KHz. The FCB is repeated every tenth frame for the first four times, and then for the fifth time, the FCB is repeated on the eleventh frame. This frame sequence is then repeated indefinitely, to maintain synchronization between the remote station and the base station.

From the information in the FCB, the remote station is able to roughly synchronize itself with the time slot(s) allocated to it. This rough time synchronization is then sufficient to locate the SB, which is typically located eight bursts after the FCB, and to decode the information it carries. The information obtained by decoding the SB is then used to finely tune the local frequency reference of the remote station to the carrier frequency of the base station and to adjust the remote station's local time reference to the time slot(s) allocated to it by the base station.

In systems employing CDMA, each base station transmits a frequency synchronization signal in the form of, for example, a pilot sequence on each of the frequencies assigned to that particular base station as well as possibly on some or all of the frequencies that are not assigned to that particular base station. If the frequency has been assigned to the base station, the corresponding pilot sequence may be transmitted with slightly more power than the other frequencies used by the base station. Each remote station receiving the carrier modulated by the pilot sequence demodulates the signal. As a result, each remote station can receive signals designated for it and simultaneously measure the signal strengths of neighboring base stations using different pilots or carriers. This information is used by the remote station to determine which received pilot sequence has the strongest signal strength, and the local frequency reference of the remote station is adjusted to the appropriate carrier frequency, accordingly.

Any frequency difference between the local frequency reference of the remote station and the carrier frequency of the base station is readily detected in the demodulated frequency synchronization signal. For example, in systems complying with the GSM standard, the difference between the frequency of the modulated frequency synchronization signal, which is known to be 67.7 KHz, and the frequency of the received frequency synchronization signal, demodulated to the baseband, is a direct measure of the error in the local frequency reference of the remote station. In systems employing CDMA, the difference between the known frequency of the strongest transmitted pilot sequence and the frequency of the demodulated pilot sequence is used by the remote station as a measure of the error in the local frequency reference of the remote station.

In order to synchronize a remote station to a base station, it is therefore important to accurately detect the frequency synchronization signal transmitted from the base station. Many techniques have been proposed for detecting the frequency synchronization signal, one of which is disclosed in C. Fjelner and E. Sward, Implementation of Digital Frequency Correction Burst Detector with Field Programmable Gate Arrays (1994) (Master thesis, Lund University). This technique is designed for detection of an FCB modulated signal in a GSM system. According to this technique, the FCB modulated signal can be detected by measuring the phase of the received signal from the base station as a function of time and differentiating this phase. Since the FCB transforms into a sinusoidal signal after modulation, the phase of the FCB modulated signal transmitted from the base station increases linearly as a function of time. Therefore, differentiation of the phase of a received signal corresponding to the FCB results in a constant. Unlike the phase of a signal modulated with an FCB, the phase of a signal modulated with, e.g., an NB does not increase linearly as a function of time. Therefore, differentiation of a phase of a received signal which does not correspond to the FCB does not result in a constant. By differentiating the phase of a received signal and examining the results, it can thus be determined whether the received signal corresponds to an FCB.

FIG. 1 shows an implementation of this technique. As shown in FIG. 1, the phase of a received signal y(n) at time n is measured in a Phase Measuring Circuit 10 which outputs the phase $\phi_y(n)$ of the received signal as a function of time n. The phase $\phi_y(n)$ is differentiated and unwrapped in a Differentiator/Unwrapper 20. The phase can vary between successive samples by an amount between 0 and $2\pi$. To keep the differentiated phase bounded in the interval $(-\pi, \pi)$ and thus simplify the detection process, the phase $\phi_y(n)$ can be shifted, i.e., "unwrapped", prior to differentiation to eliminate the $2\pi$ jumps. Alternately, the phase can be unwrapped after differentiation, e.g., by shifting the differentiated phase by $2\pi$ or $-2\pi$ when the differentiated phase is larger or smaller than $\pi$ or $-\pi$, respectively.

The differentiated and unwrapped phase $\Delta\phi_i$ is filtered in a Low Pass (LP) Filter 30. The output $(\Delta\phi_i)_{LP}$ of the LP Filter 30 experiences a dip or jump for an input differentiated phase corresponding to an FCB. Thus, an FCB can be detected simply by detecting a dip or jump in the output $(\Delta\phi_i)_{LP}$.

A modified version of the conventional differentiation-based detection technique is also illustrated in FIG. 1. According to this modified technique, a Frequency Selective Filter 5, indicated in FIG. 1 by dashed lines, can be used to filter out corrupting noise v(n) outside the frequency region surrounding the carrier frequency of the FCB. This modified approach improves the signal-to-noise ratio (SNR) of the detection system.

Though simple to implement, the modified and unmodified conventional differentiation-based techniques of FIG. 1 may falsely classify signals as FCBs which are not FCBs. The linearly increasing phase of an FCB results from the fact that the FCB is typically obtained by modulating the carrier with a sequence of zeros (0, 0, 0, . . . ). A linear phase can also be obtained for signals which do not correspond to an FCB, e.g., a sequence of ones (1, 1, 1, . . . ) or alternate bits (1, 0, 1, 0, . . . ). Using the approach illustrated in FIG. 1, these sequences result in the same LP Filter output as an FCB. However, it is unlikely that 148 bits in a row are 111 . . . or 1010 . . . Thus, when a 148-bit-long sequence of all zeroes, which corresponds to a linear phase, is obtained, this is an indication that the signal detected is an FCB.

There is thus a need for a technique for accurately detecting a frequency synchronization signal which overcomes the drawbacks noted above.

SUMMARY

It is therefore an object of the present invention to provide a method and apparatus for accurately detecting a frequency synchronization signal.

According to an exemplary embodiment of the present invention, in a communication system including at least one transmitter and at least one receiver, a frequency synchronization signal transmitted from the transmitter to the receiver is detected. An in-phase component of a signal received by the receiver is delayed, and the delayed in-phase component is multiplied by a quadrature component of the received signal. The steps of delaying and multiplying are repeated for a predetermined number of samples of the received signal and the products are smoothed to produce an estimated cross-correlation value. A determination is made whether the estimated cross-correlation value is at least as great as a predetermined threshold, indicating that the signal transmitted from the transmitter is a frequency synchronization signal.

According to an exemplary embodiment, the in-phase and quadrature components are normalized before multiplication. Products are formed for a predetermined number of samples which corresponds to the number of symbols in the frequency synchronization signal. According to another embodiment, cross-correlation values are estimated for a predetermined number of samples which corresponds to an approximate number of symbols in the frequency synchronization signal. According to yet another embodiment, the in-phase and quadrature components are filtered to remove surrounding noise.

If the received signal is a frequency synchronization signal, a frequency offset between a local frequency reference of the receiver and a carrier frequency of the transmitter can be determined based on the estimated cross-correlation value. The frequency offset can be used to tune the local frequency reference of the receiver to the carrier frequency of the transmitter. The quality of the estimated frequency offset can be measured, indicating whether the frequency offset needs to be recomputed and/or whether the detection is accurate.

BRIEF DESCRIPTION OF THE DRAWINGS

The features, objects, and advantages of the invention will become apparent by reading this description in conjunction with the accompanying drawings, in which like reference numerals refer to like elements and in which.

DETAILED DESCRIPTION

For illustrative purposes, the following description is directed to a radio communication system complying with the GSM standard. It will be understood that this invention is not so limited but applies to other types of communication systems employing different standards.

Figure 2:
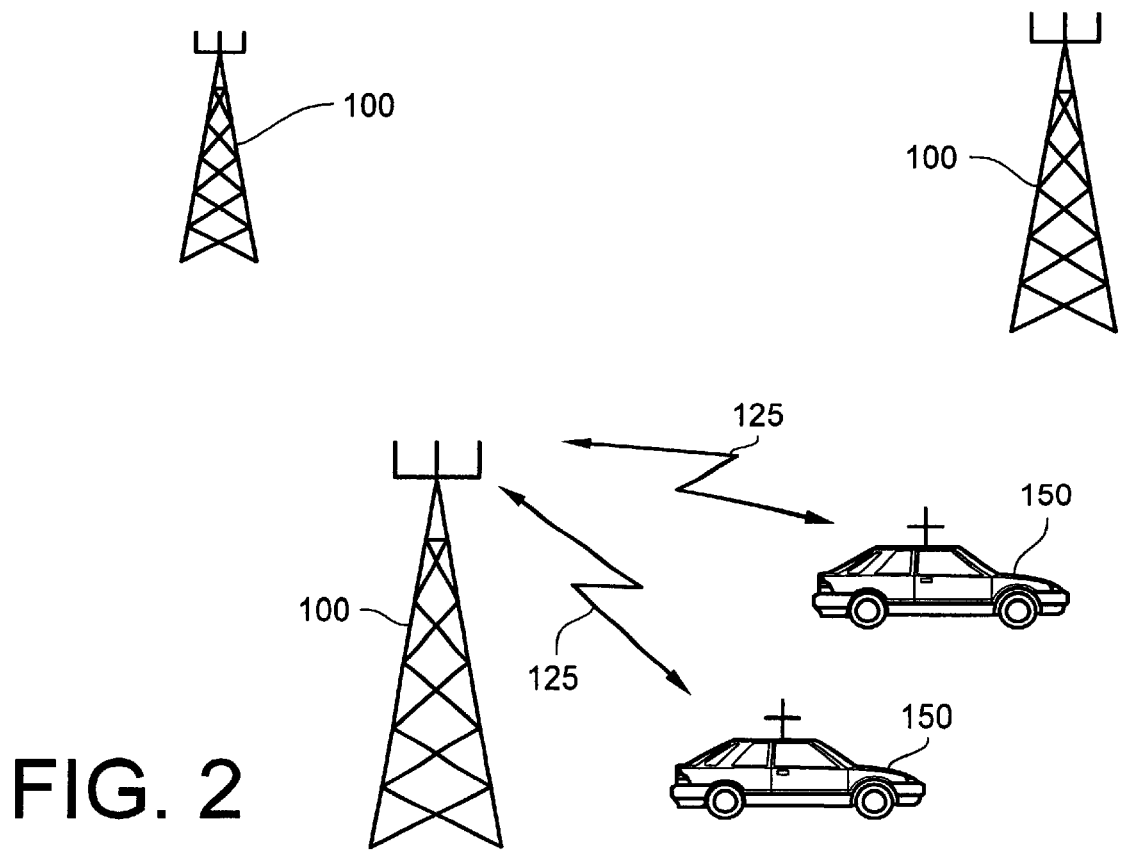
FIG. 2 illustrates a communication system in which the present invention can be implemented.

FIG. 2 illustrates an exemplary communication system in which the present invention can be implemented. The system includes at least one transmitter 100 and at least one receiver 150. Although the transmitter 100 and the receiver 150 are depicted in FIG. 2 as a base station and a mobile station, respectively, it will be appreciated that the transmitter can be implemented in many ways, e.g., as a terrestrial or satellite repeater, and the receiver can be implemented in many ways, e.g., as a fixed cellular terminal (wireless local loop). A base station and a mobile station are depicted in FIG. 2 and described in the following for illustrative purposes only.

The base station 100 and the mobile station 150 communicate via a radio air interface 125. Each neighboring base station 100 is assigned a particular carrier frequency, and each base station 100 allocates specific time slots for each mobile station 150.

To communicate with a base station 100, a mobile station 150 must be time and frequency synchronized to the base station 100. In other words, the local frequency reference and time reference of the mobile station 150 must be synchronized with the carrier frequency assigned to the base station 100 and the time slot(s) allocated by the base station, respectively. In a CDMA system, the mobile station 150 must be synchronized with the base station's carrier frequency and the code words transmitted.

To synchronize the mobile station 150, the base station 100 transmits a frequency synchronization signal to the mobile station. For example, in systems employing the GSM standard, the base station 100 modulates its carrier frequency with a FCB to form a frequency synchronization signal.

The frequency synchronization signal $x_c(t)$ can be represented as:

$$x_c(t) = \sqrt{P}\cos(\Omega_c t + \phi_c(t) + \theta), \quad (1)$$

where $\sqrt{P}$, $\Omega_c t$, $\phi_c(t)$, and $\theta$ denote the carrier amplitude, the carrier frequency, the carrier phase, and an initial phase, respectively, at time t.

The mobile station 150 receives and demodulates signals transmitted from the base station 100, including the frequency synchronization signal $x_c(t)$. The detected frequency synchronization signal in the baseband can be represented as a complex-valued sampled signal x(n):

$$x(n) = \sqrt{P}\exp\{j(\phi_x(n)+\theta)\} \forall n \in \Psi \quad (2)$$

where $\phi_x(n)$ represents the phase of the baseband signal x(n), $\Psi$ refers to the set of discrete time indices corresponding to the FCB, e.g., $n_0, n_0+1, \ldots, n_0+N_0-1$, where $N_0$ represents the total number of samples in the FCB.

For an FCB, the carrier phase $\phi_c(t)$ can be written as $$\frac{\pi}{2T_S}t$$

where $T_S$ represents the symbol duration, approximately 48⁄13 μs. Substituting for $\phi_x(n)$ and sampling at a rate $F_S=1/T_S$ or 270.833 KHz, Equation 2 can be rewritten as:

$$x(n) = \sqrt{P}\exp\left\{j\left(\frac{\pi}{2}n + \theta\right)\right\} \forall n \in \Psi \quad (3)$$

Any frequency offset $\Delta F$ between the local frequency reference of the mobile on and he carrier frequency of the base station changes Equation 3 to:

$$x(n) = \sqrt{P}\exp\left\{j\left(2\pi n\left(\frac{\Delta F}{F_s}+\frac{1}{4}\right)\right)\right\} \forall n \in \Psi \quad (4)$$

The signal model of Equation 4 does not take noise into account. The actual received frequency synchronization signal y(n), which includes noise v(n), can be represented as:

$$y(n)=x(n)+v(n) \quad (5)$$

The complex-valued noise v(n) can be written as:

$$v(n)=v_I(n)+jv_Q(n) \quad (6)$$

where $v_I(n)$ and $v_Q(n)$ represent the in-phase and quadrature noise components, respectively. The noise v(n) may be assumed to have a white, Gaussian distribution, $v(n) \in N(0, \sigma_v^2)$ such that the components $v_{I(n)}$ and $v_Q(n)$ are real-valued with variance $\sigma_v^2/2$ and are assumed to be uncorrelated.

The in-phase and the quadrature components of the received signal y(n) can be represented as:

$$y_I(n) = \sqrt{P}\cos\left(2\pi n\left(\frac{\Delta F}{F_s}+\frac{1}{4}\right)\right)+v_I(n) \quad (7)$$

$$y_Q(n) = \sqrt{P}\sin\left(2\pi n\left(\frac{\Delta F}{F_s}+\frac{1}{4}\right)\right)+v_Q(n) \quad (8)$$

According to an exemplary embodiment of the present invention, the similarity of the in-phase and quadrature components $y_I(n)$ and $y_Q(n)$ can be used to detect the FCB. If the mobile station is synchronized to the base station, i.e., $\Delta F=0$, every period of the sinusoid of the FCB contains four samples. Moreover, the $y_I(n)$ and $y_Q(n)$ components of the FCB are phase shifted by $\pi/2$ and thus differ from each other by one sample. Thus, for a received signal corresponding to an FCB, $y_Q(n)$ can be obtained by delaying $y_I(n)$ by one time index.

If the mobile station is not synchronized to the base station, i.e., $\Delta F \neq 0$, then $y_Q(n)$ does not equal $y_I(n-1)$, since:

$$y_I(n-1) = \sqrt{P}\sin\left(2\pi n\left(\frac{\Delta F}{F_s}+\frac{1}{4}\right)-2\pi\frac{\Delta F}{F_s}\right) \quad (9)$$

For a signal corresponding to an FCB, cross-correlating $y_I(n-1)$ and $y_Q(n)$ produces the following cross-correlation value $r_{IQ}(1)$:

$$r_{IQ}(1) = \frac{P}{2}\cos\left(2\pi\frac{\Delta F}{F_s}\right) \forall n \in \Psi \quad (10)$$

where the general cross-correlation of two signals, e.g., w(n) and v(n) is given by:

$$r_{wv}(k)=E\{w(n-k)v(k)\} \quad (11)$$

As can be seen from Equation 10, cross correlating $y_I(n-1)$ and $y_Q(n)$ results in a peak whenever the received signal corresponds to an FCB. The magnitude of the peak is dependent on the carrier amplitude and the frequency offset $\Delta F$. As $\Delta F$ grows, the magnitude of the peak decreases. If a signal corresponding to, for example, an NB or noise is received, there is no correlation between $y_I(n-1)$ and $y_Q(n)$. Thus, by determining whether the cross-correlation value has a peak which is at least as great as a predetermined detection threshold, it can be determined whether or not the signal transmitted from the base station corresponds to an FCB.

There are several potential problems to take into consideration when implementing cross-correlation to detect the FCB. One problem is the variation in carrier amplitude, due both to fading and propagation loss. The variation in carrier amplitude affects the peak value of Equation 10 and makes it difficult to select a detection threshold.

To reduce the effect of the carrier amplitude variation, the incoming data y(n) can be normalized, e.g., by dividing y(n) by its 2-norm $\sqrt{y_I^2(n)+y_Q^2(n)}$. The hardware implementation of this division can be costly, however.

A less costly alternative is to convert the received signal y(n) from the Cartesian domain to the Polar domain and then reconvert the signal back to the Cartesian domain. This can be implemented with two tables, one for the conversion from the Cartesian domain to the Polar domain and the other for conversion from the Polar domain to the Cartesian domain. The normalization is performed by using the first table to obtain the signal phase corresponding to the in-phase and quadrature components of the received signal and the second table to obtain the normalized in-phase and quadrature components from the signal phase and unity amplitude.

In order to detect the FCB using the cross-correlation technique described above, the quantity on the right side of Equation 10 must first be determined. One way to determine this value is to estimate the cross-correlation value $r_{IQ}(1)$ as follows:

$$e\{r_{IQ}(1)\} = \frac{1}{\text{length}(\Psi)} \sum_{n \in \Psi} y_I(n-1) y_Q(n) \quad (12)$$

where $e\{r_{IQ}(1)\}$ denotes an estimated cross-correlation value, and length ($\Psi$) corresponds to the length of the FCB, i.e., the number of symbols in the FCB. Thus, by multiplying $y_I(n-1)$ by $y_Q(n)$ for each of a number of samples of the received signal corresponding to the length of an FCB and averaging these products, the cross-correlation value of Equation 10 can be estimated.

Figure 3:
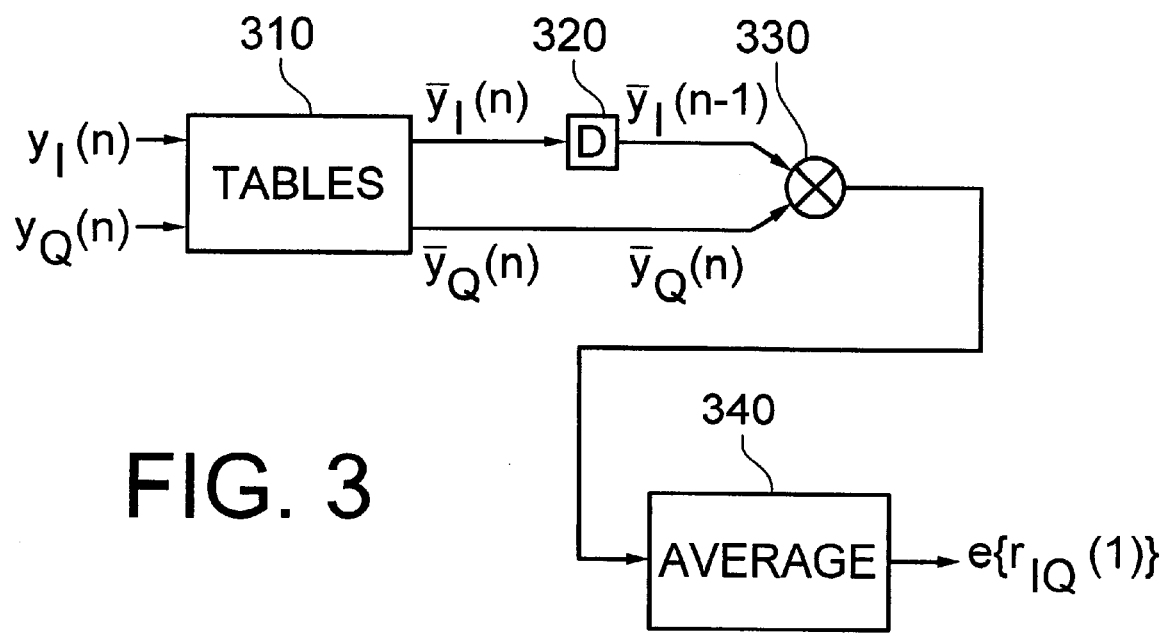
FIG. 3 illustrates an apparatus for detecting a frequency synchronization signal according to a first embodiment of the present invention.

FIG. 3 illustrates an apparatus for detecting a frequency synchronization signal according to a first embodiment of the present invention. The apparatus includes a Normalizer 310 into which in-phase and quadrature components $y_I(n)$ and $y_Q(n)$ of a signal y(n) received from the base station are input at a given time n. These components can be obtained according to any suitable technique, such as that disclosed in U.S. Pat. No. 5,276,706 to Critchlow.

The Normalizer 310 normalizes the components $y_I(n)$ and $y_Q(n)$, thus reducing effects of, e.g., fading. As shown in FIG. 3 and described above, the Normalizer 310 can be implemented with conversion tables. The normalized in-phase component is passed through a Delay 320 and delayed by one sample. The delayed in-phase component and the normalized quadrature component are multiplied together by the Multiplier 330 and averaged, e.g., by an Averager 340 to produce an estimated cross-correlation value $e\{r_{IQ}(1)\}$. The Averager 340 can be implemented with, for example, a LP filter, which makes this method less complicated than averaging with an FIR filter. If the estimated cross-correlation value has a peak which is at least as great as a predetermined detection threshold, then the signal transmitted from the base station corresponds to an FCB. The detection threshold can be preselected as described below with reference to FIGS. 8A–9F.

Another problem to take into consideration when implementing cross-correlation to detect the FCB is the corrupting additive noise v(n) which decreases the SNR and thus affects the detector performance. According to a second embodiment of the present invention, the received signal y(n) can be prefiltered by a frequency selective filter that selects the frequency band corresponding to the FCB to discriminate the FCB from surrounding noise and thus enhance the SNR.

As explained above, in a system employing the GSM standard, the frequency of the transmitted frequency synchronization signal is approximately 67.7 KHz. The frequency of the received frequency synchronization signal may deviate from 67.7 KHz, due to the lack of the synchronization between the carrier frequency of the base station and the local frequency reference of the mobile station. The amount of frequency deviation that can be tolerated depends on the precision of the internal crystal oscillator of the detector in the mobile station. For example, assuming that the precision of this crystal is ±16 parts per million (ppm), in the GSM 900 MHZ band, there can be a frequency offset of up to ±14.4 KHz in the received frequency synchronization signal. Thus, theoretically the bandwidth of a frequency selective filter can be set up to ±14.4 KHz around 67.7 KHz, i.e., between 53.3 KHz and 82.1 KHz to suppress the background noise. According to an exemplary embodiment, a slightly narrower bandwidth can be conveniently used, e.g., ±13 KHz around 67.7 KHz, corresponding to approximately 0.05 $F_s$.

The bandwidth of the frequency selective filter can be suited to the standard of the communication system. For a system using the CTS standard, for example, the frequency deviation may be twice that of a system using the GSM standard. This is due to the addition of the frequency error of the mobile station and the home base station in the CTS standard. Thus, a frequency deviation of up to ±28.8 KHz can be tolerated in a system employing the CTS standard. The filter bandwidth in such a system can thus theoretically be chosen to be up to ±28.8 KHz around the frequency of the transmitted frequency synchronization signal. When actually implementing the selective filter, the bandwidth can be conveniently selected to be ±27 KHz around the frequency of the transmitted frequency synchronization signal, corresponding to approximately 0.1 $F_s$.

Regardless of the frequency deviation which can be tolerated by a system, there is no need to choose a very wide filter bandwidth since the channel filtering will limit the received signal to approximately [0 . . . 85] KHz. To detect the FCB if $\Delta F$ is very large, detection can be performed by using a progressively larger detection bandwidth, i.e., by generating a progressively larger frequency in the local oscillator.

The frequency selective filter can be implemented with a bandpass (BP) filter, e.g., an Infinite Impulse Response (IIR) filter, or a LP filter with suitable shifting. It is usually simpler to implement a LP filter than a BP filter, if the filters have similar bandwidths, because a BP filter normally has twice as many coefficients as a LP filter. This is not true, however, when the center frequency of the BP filter is one fourth of the sampling frequency. In this case, half of the filter coefficients, i.e., the odd coefficients, of the BP filter are equal to zero, so that both the BP filter and the LP filter have an equal number of coefficients. Thus, choosing the center frequency of 67.7 KHz for the FCB, which corresponds to ¼ of the sampling frequency, makes a BP filter as simple to implement as a LP filter. However, a BP filter requires twice as many delays as a LP filter, so that using a BP filter as the frequency selective filter would require twice the number of clock cycles compared to using a LP filter.

Of course, using a LP filter requires that the signal be shifted to the baseband before filtering, then reshifted after filtering. This adds to the complexity of using a LP filter. It is possible to use the baseband signal directly so that the need for shifting is eliminated, making a LP filter even more practical to implement. For the sake of completeness, however, and since shifting is relatively inexpensive to implement, the following embodiment describes a LP filter with suitable shifting.

According to an exemplary embodiment, the received signal can be shifted from the center frequency of 67.7 KHz to the baseband, the shifted signal can be lowpass filtered, and then the filtered signal can be reshifted back to the center frequency. The shifting can be implemented by multiplying the in-phase and quadrature components $y_I(n)$ and $y_Q(n)$ of the received frequency synchronization signal y(n) by exp ($-2\pi j n\ 67.7/270.833$)=exp($-\pi jn/2$), which is a sequence of {1, 0, −1, 0} in the real and imaginary domains.

The shifting can be performed according to the following:

$$(y_I(n) + jy_Q(n))e^{-\pi jn/2} = \begin{cases} y_I(n) + jy_Q(n), & n = 0, 4, 8, \ldots; \\ y_I(n) - jy_Q(n), & n = 1, 5, 8, \ldots; \\ -y_I(n) - jy_Q(n), & n = 2, 6, 10, \ldots; \\ -y_I(n) + jy_Q(n), & n = 3, 7, 11, \ldots \end{cases} \quad (13)$$

The shifting can be performed by changing the sign of $y_I(n)$ and $y_Q(n)$ and then combining these components. The reshifting can be done in the same manner.

Figure 4:
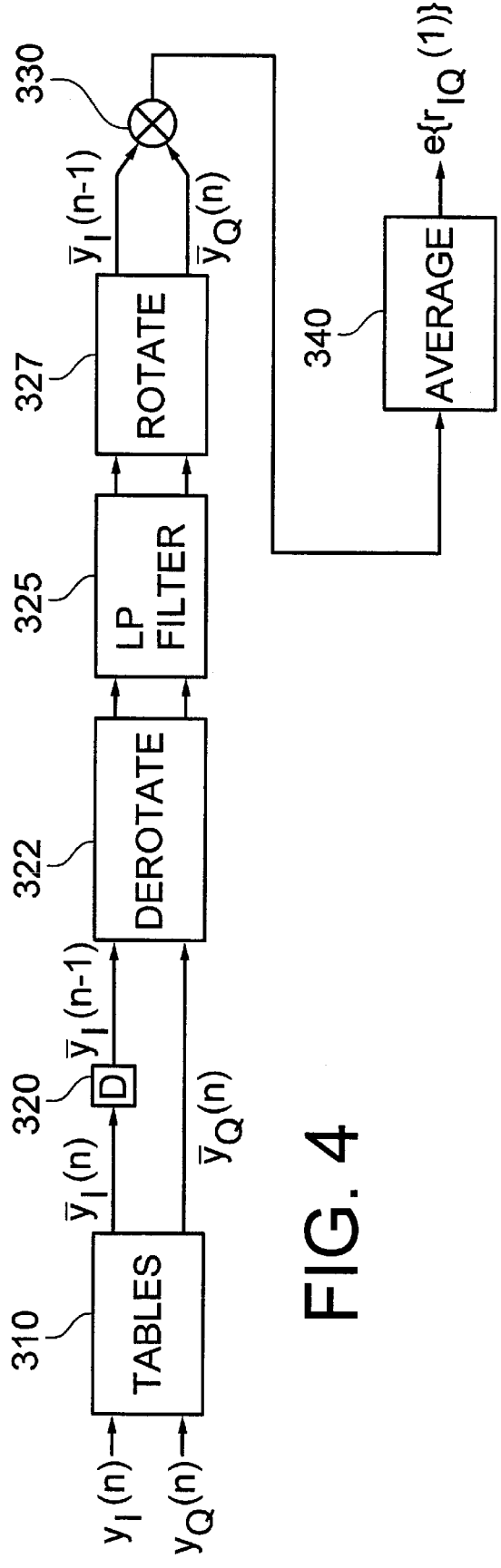
FIG. 4 illustrates an apparatus for detecting a frequency synchronization signal according to a second embodiment of the present invention.

This approach can be implemented in the apparatus shown in FIG. 4. The elements shown in FIG. 4 are the same as those in FIG. 3, except for the addition of a Derotator 322, a LP Filter 325, and a Rotator 327. The Derotator 322 derotates, i.e., shifts, the delayed and normalized in-phase component and the normalized quadrature component to the baseband, the LP Filter 325 low pass filters the derotated components to remove surrounding noise, and the Rotator 327 rotates, i.e., reshifts the low pass filtered components back to the center frequency. Then, the components are multiplied and averaged to estimate the cross-correlation value as described above with reference to FIG. 3.

Although the frequency selective filter shown in FIG. 4 is arranged between the Delay 320 and the Multiplier 330, it should be understood that the frequency selective filter can be arranged in any other suitable place, e.g., in front of the Normalizer 310.

The frequency selective filter according to the second embodiment enhances the SNR by reducing the noise outside the frequency band of interest, i.e., the noise surrounding the frequency 67.7 KHz of the received FCB. Theoretically, the noise is reduced to zero outside the frequency band of interest, and the SNR increases by 10 log(0.5/0.05)=10 dB and 10 log(0.5/0.1)=7 dB in systems employing the GSM standard and the CTS standard, respectively. In reality, the noise is not reduced to zero, but the noise reduction is still sufficient to produce the desired SNRs.

In the foregoing embodiments, estimation of the cross-correlation value requires smoothing of the product of $y_I(n-1)$ and $y_Q(n)$ over a length of an FCB. Since an FCB contains 148 symbols, a memory is required that is long enough to store 148 in-phase components and 148 quadrature components to implement this averaging across the length of the FCB. This can be costly.

The method of estimation in Equation 12 can be modeled as a Moving Average (MA) process with the transfer function:

$$B(z) = b_0 + b_1 z^{-1} + \ldots + b_{147} z^{-147} \quad (14)$$

where all the coefficients $\{b_k\}$ are equal to $1/148$. This MA process can be implemented with a filter with a 148 sample long memory.

The MA process can be rewritten as an Auto Regressive (AR) process having the transfer function:

$$\frac{1}{A(z)} = B(z) + R(z) \quad (15)$$

where $A(z)$ is a polynomial with an order less than $B(z)$, and $R(z)$ is a rest term. The quantity of the rest term $R(z)$, also referred to as bias, depends on how closely $1/A(z)$ approximates $B(z)$. Ideally, $1/A(z)$ should not significantly deviate from $B(z)$, and the bias $R(z)$ should be small. Equation 15 can be approximated as follows:

$$\frac{1}{A(z)} = \frac{\frac{1}{148}}{1 - z^{-1}} \quad (16)$$

Although this approximation results in a value for $1/A(z)$ which is exactly equal to $B(z)$, Equation 16 tends to be unstable. In addition, the rest term $R(z)$ remains large in this approximation. A less accurate but stable approximation for $B(z)$ is:

$$\frac{1}{A(z)} = \frac{C}{1 - \alpha z^{-1}} \quad (17)$$

where $0<\alpha<1$, and the constant C is to used adjust the gain at z=0 to unity. A simple choice for $\alpha$ is $1-1/128$ which makes C equal to $1/128$. The benefit of having a related to a power of two is that the division by 128 can be implemented with a simple right shift by seven bits. The approximation in Equation 17 is an exponential averaging which can be implemented with a filter having a memory that is approximately $(1-\alpha)^{-1}=128$ samples long.

Figure 5:
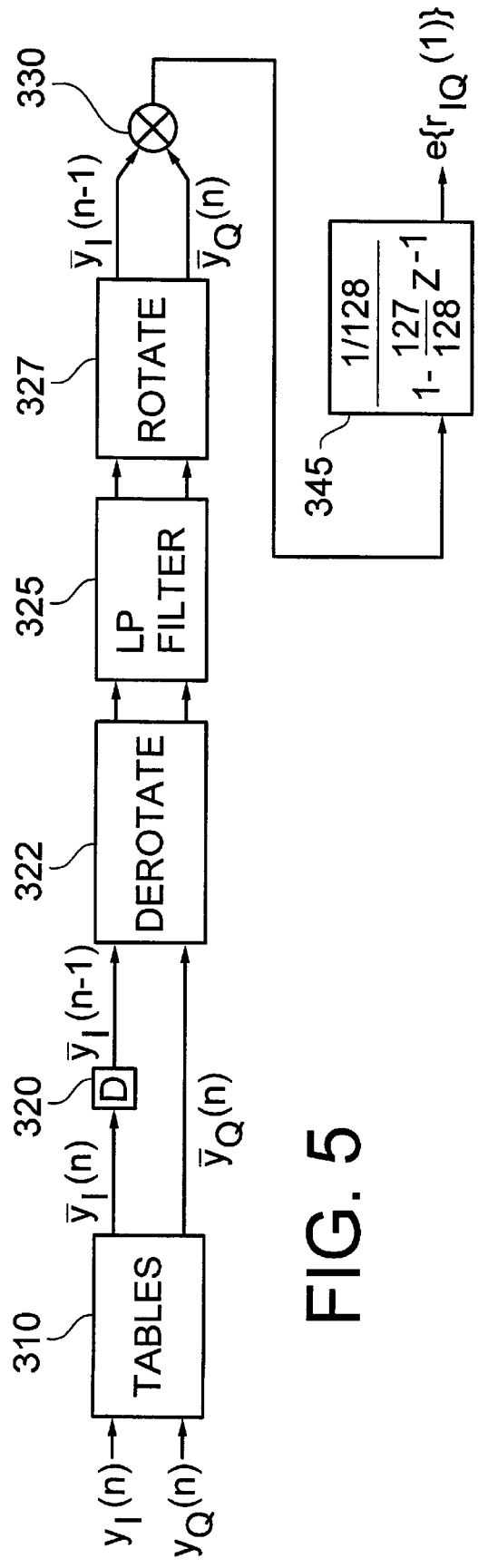
FIG. 5 illustrates an apparatus for detecting a frequency synchronization signal according to a third embodiment of the present invention.

According to a third embodiment, this approximated averaging can be implemented in the apparatus illustrated in FIG. 5. The components in FIG. 5 are similar to those illustrated in FIGS. 3 and 4, except that the Averager 340 is replaced with a Moving Averager 345. The Moving Averager 345 has the transfer function:

$$H(z) = \frac{\frac{1}{128}}{1 - \frac{127}{128} z^{-1}} \quad (18)$$

which corresponds to the substitution of $C=1/128$ and $\pi=1-1/128$ in Equation 17.

The estimated cross-correlation value $e\{r_{IQ}(1)\}$ can be used in place of the actual cross-correlation value $r_{IQ}(1)$ to determine the frequency offset between the carrier frequency of the base station and the local frequency reference of the mobile station. The frequency offset $\Delta F$ is related to the cross-correlation value and the carrier amplitude in the following manner:

$$\Delta F = \frac{F_s}{2\pi} \arccos\left(\frac{2}{P} r_{IQ}(1)\right) \forall n \in \Psi \quad (19)$$

Using the frequency offset $\Delta F$, the carrier frequency of the base station can be derived.

To improve the estimation for the frequency offset, the following relationship can be used:

$$r_{IQ}(1) = \frac{-P}{2} \sin\left(2\pi \frac{\Delta F}{F_s}\right) \quad (20)$$

In combination with the property that $\sin^2(\pi)+\cos^2(\pi)=1$, the frequency offset can be estimate a $$e\{\Delta F\} = \frac{F_s}{2\pi} \arccos\left(\frac{e\{r_{IQ}(1)\}}{\sqrt{e\{r_{IQ}^2(1)\} + e\{r_{II}^2(1)\}}}\right) \quad (21)$$

Other estimation techniques can be used to estimate the frequency offset $\Delta F$, e.g., the estimation technique described in the copending U.S. Patent Application entitled "Method and Apparatus for Estimating a Frequency Offset", filed on Nov. 17, 1997 in the names of Roozbeh Atarius and Dr. Georg Frank, and incorporated here by reference.

A quality factor δ can also be estimated which indicates the accuracy of the estimated frequency offset and whether or not the frequency offset needs to be recomputed and/or whether the detection is accurate. The estimated quality factor e{δ} can be computed as described in the copending U.S. Patent Application.

Figure 6:
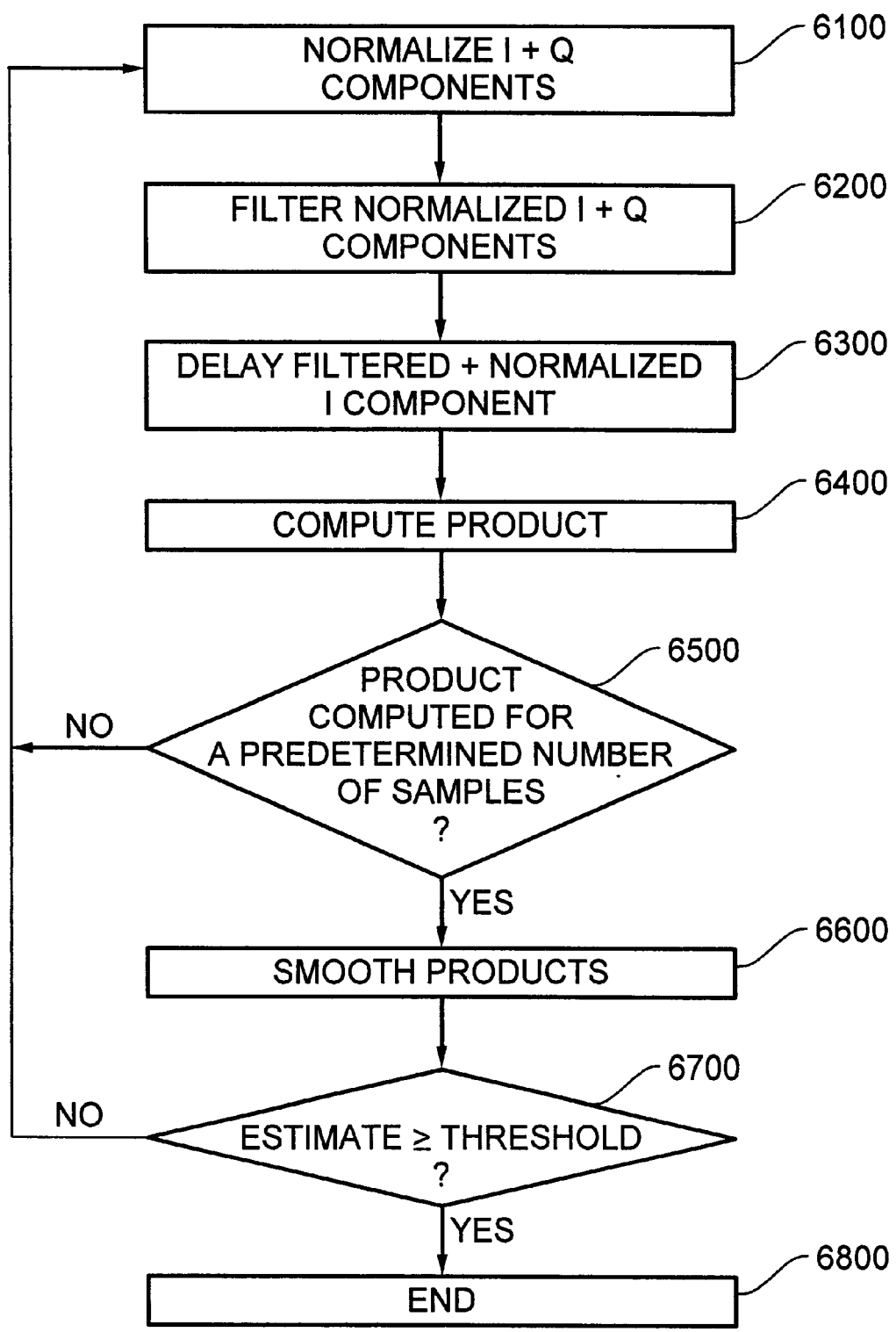
FIG. 6 illustrates a method for detecting a frequency synchronization signal according to an exemplary embodiment of the present invention.

FIG. 6 illustrates an exemplary method for detecting a frequency synchronization signal according to the present invention. The method begins at step 6100 at which in-phase (I) and quadrature (Q) components of a received signal are normalized. At step 6200, the normalized I and Q components are filtered to remove surrounding noise. Then, at step 6300, the filtered and normalized I component is delayed. The order of the steps 6200 and 6300 can be reversed, i.e., the normalized I and Q components can be filtered after the I component is delayed. At step 6400, the normalized and filtered Q component is multiplied by the delayed, filtered, and normalized I components. At step 6500, a determination is made whether these components have been multiplied for a predetermined number of samples of the received signal, e.g., a number of samples corresponding to the length of the FCB. If not, the process returns to step 6100. When the components have been multiplied for a predetermined number of samples, the multiplication products are smoothed, e.g., averaged, at step 6600 to produce an estimated cross-correlation value. At step 6700, a determination is made whether the result is greater than a predetermined threshold. If not, the detected signal does not correspond to a frequency synchronization signal, and the method returns to step 6100. If the estimated cross-correlation value is greater than a predetermined threshold, the detected signal corresponds to a frequency synchronization signal, and the detection process ends at step 6800. The detected frequency synchronization signal can be used to estimate the frequency offset in the received frequency synchronization signal, and the mobile station can be synchronized to the base station based on the estimated frequency offset. Once the mobile station is synchronized to the base station, the method shown in FIG. 6 can be repeated to maintain synchronization.

Figure 7:
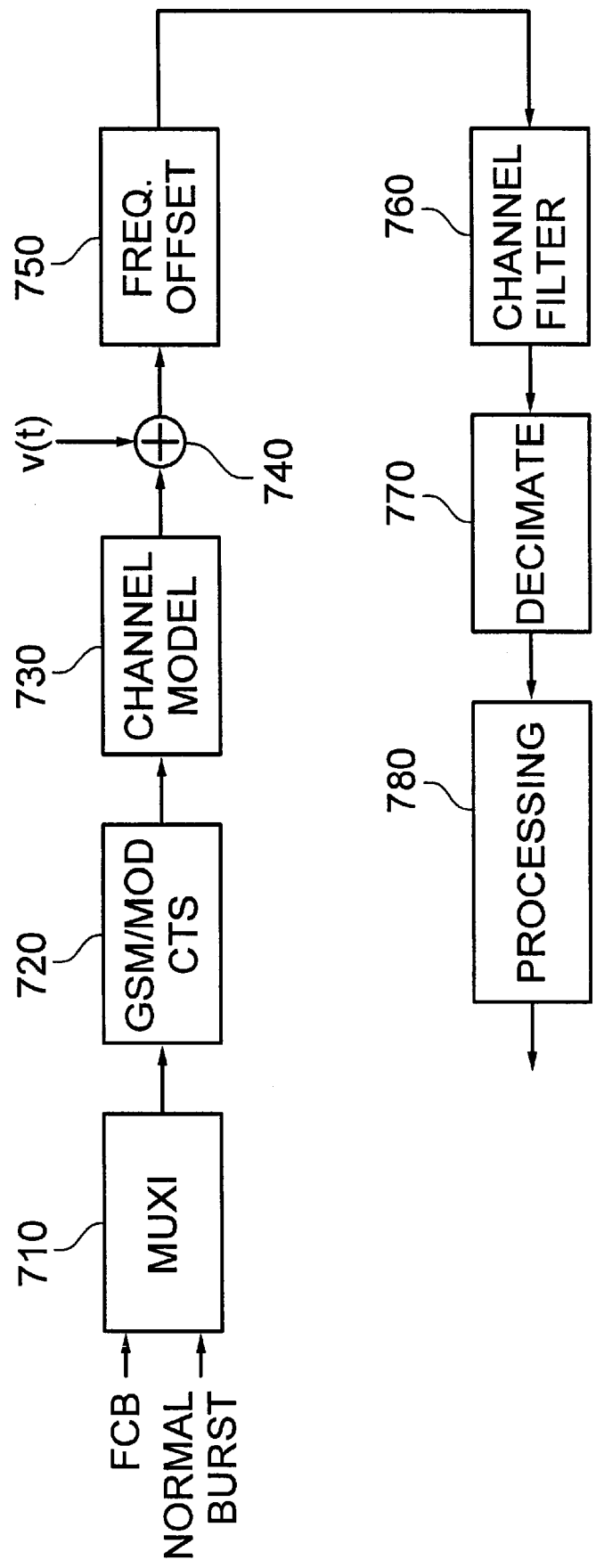
FIG. 7 illustrates a system used for simulating detection of a frequency synchronization signal.
Figure 8B:
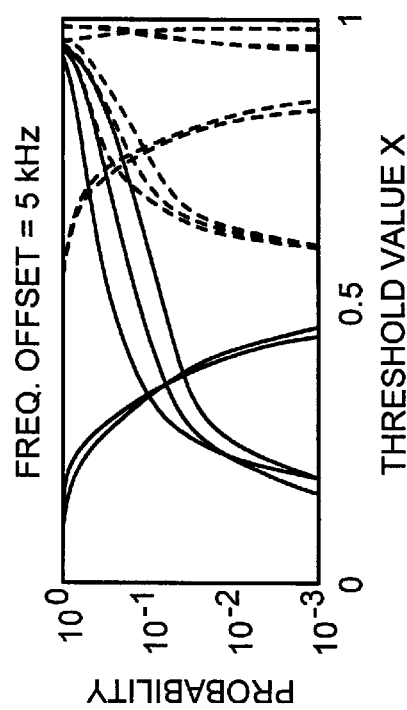
FIGS. 8A–8F illustrate detection error probabilities for a system complying with the GSM standard.
Figure 8D:
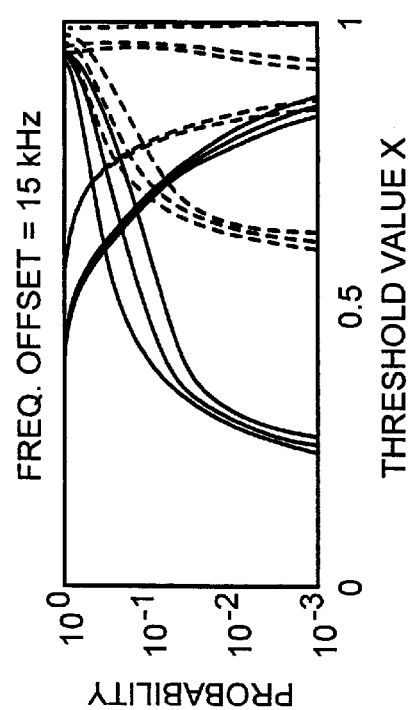
Figure 8A:
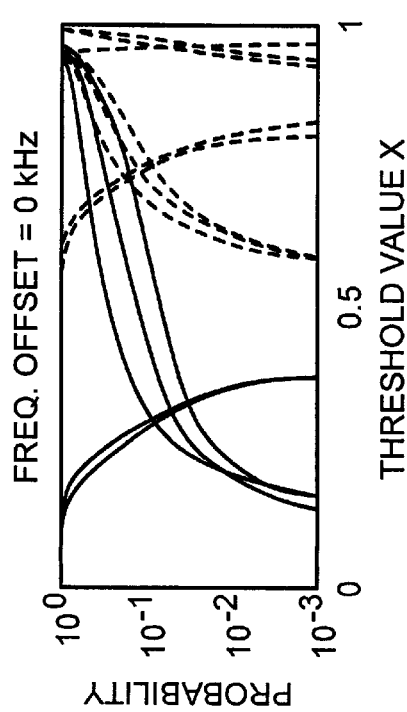
Figure 8C:
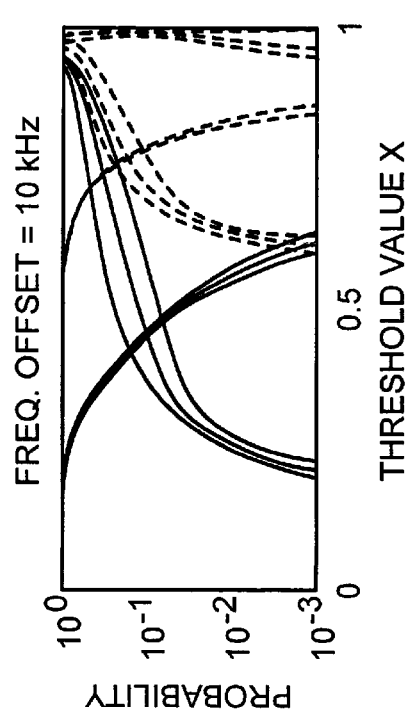
Figure 8F:
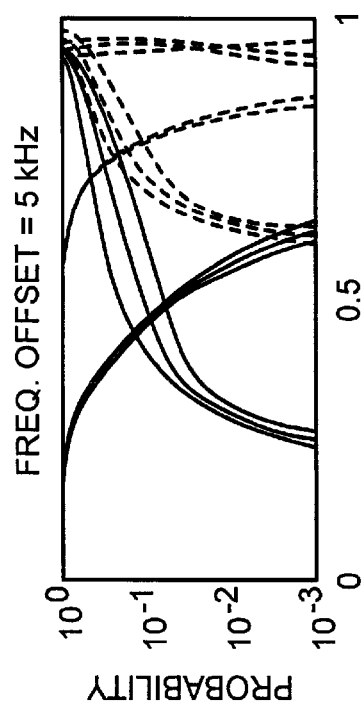
Figure 8E:
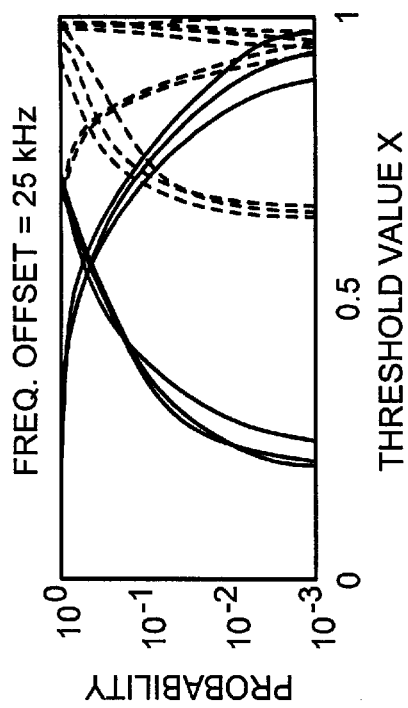
Figure 9B:
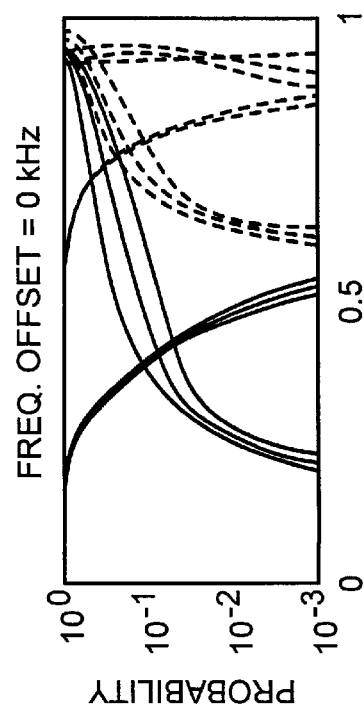
FIGS. 9A–9F illustrate detection error probabilities for a system complying with the Cordless Telephony System (CTS) standard.
Figure 9A:
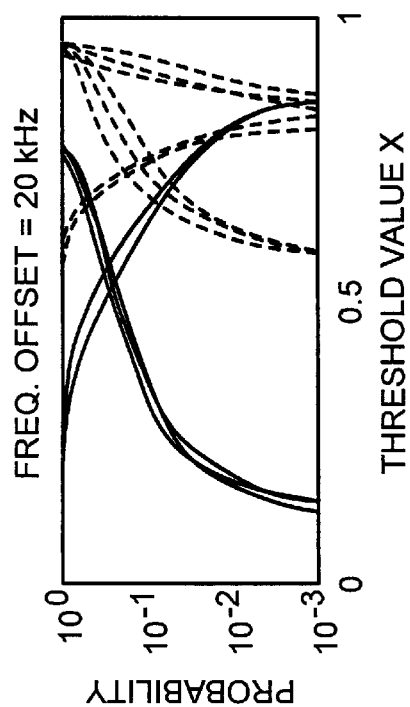
Figure 9D:
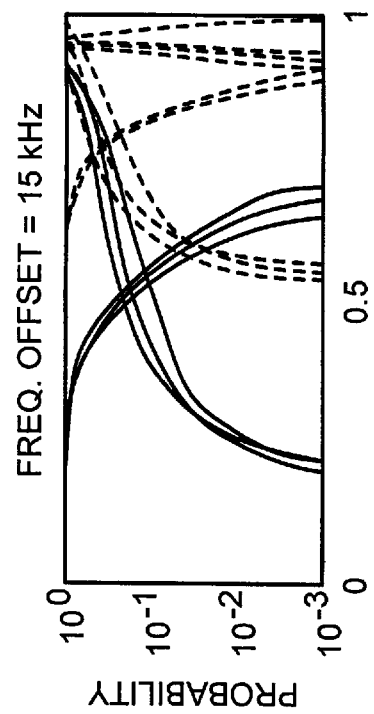
Figure 9F:
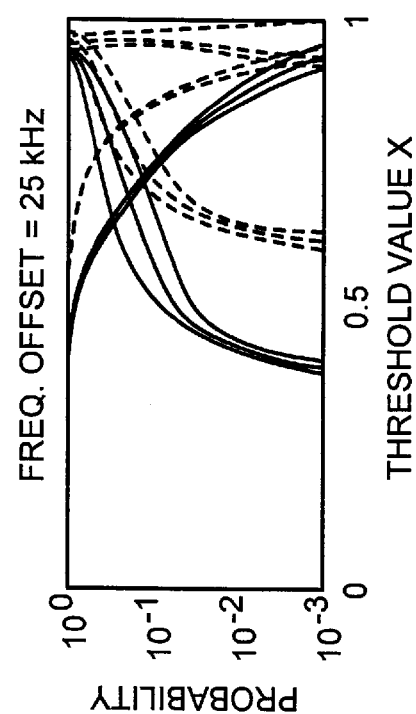
Figure 9C:
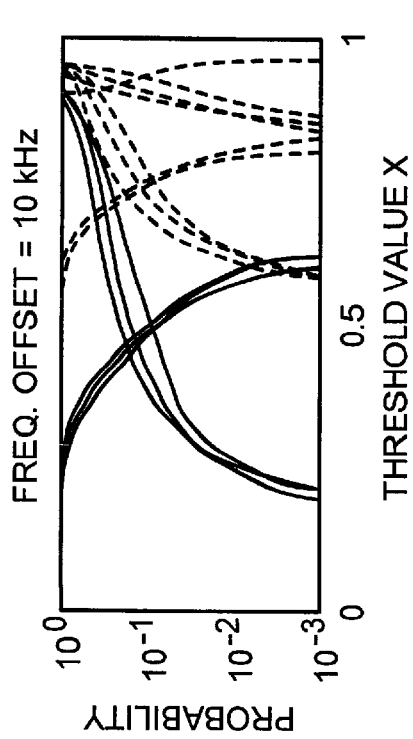
Figure 9E:
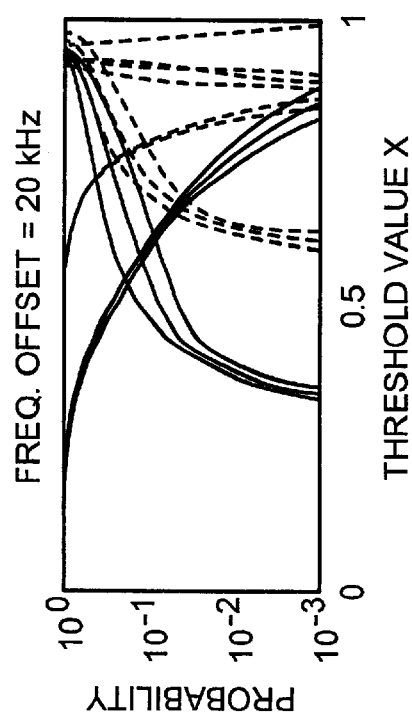

FIG. 7 illustrates a system used for simulating results of frequency synchronization signal detection employing a conventional technique, a modified conventional technique, and a technique according to an exemplary embodiment of the present invention. For the simulation, a stream of FCBs and NBs were multiplexed by a Multiplexer (MUXI) 710 and modulated onto a carrier according to the GSM specification and the CTS specification by a Modulator (GSM/CTS Mod) 720. The modulated signal was then fed through a standard Channel Model 730. White additive Gaussian noise v(t) was added via an Adder 740, and a Frequency Offset ΔF was added by a Frequency Offset Adder 750. The output of the Frequency Offset Adder 750, which represented a received signal, was filtered by a Channel Filter 760, decimated to the desired sample rate (270.833 KHz) by a Decimator 770, and finally processed by a Processor 780 to detect the frequency synchronization signal.

Figure 1:
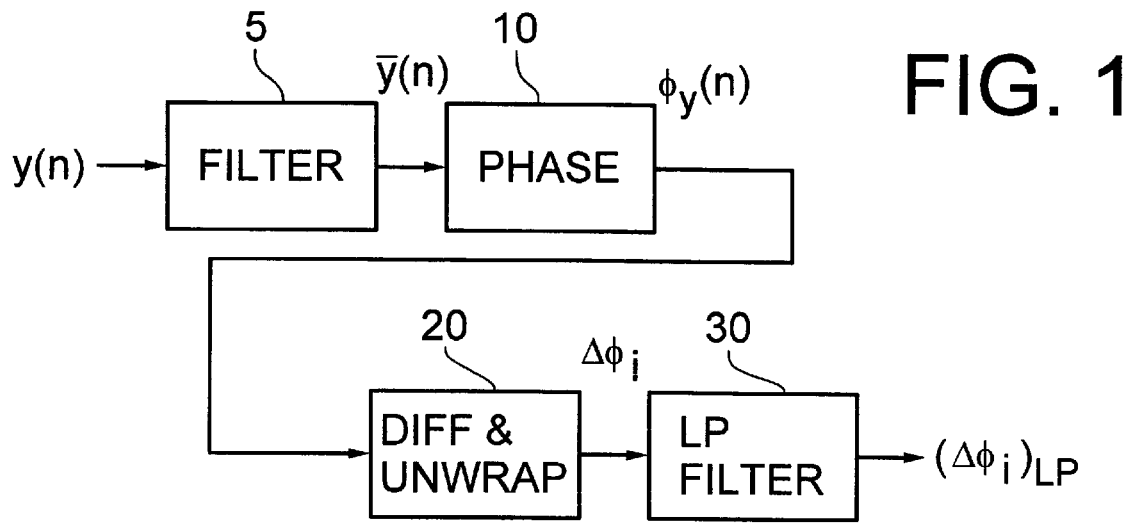
FIG. 1 illustrates a conventional apparatus for detecting a frequency synchronization signal.

The Processor 780 was implemented with components for simulating the conventional detection technique without the Filter 5 and the modified conventional detection technique with the Filter 5, as illustrated in FIG. 1, and the detection technique according to the third embodiment of the present invention as illustrated in FIG. 5. The frequency selective filter was implemented with a Bessel second order IIR filter. Two different bandwidths were chosen for this filter, 0.05 and 0.1 of the sample rate (13.5 and 27 KHz, respectively) corresponding to the GSM standard and the CTS standard, respectively.

The transmission channel used in the simulations was a Typical Urban channel. Depending on the number of obstacles between a mobile station and a base station, the transmission channel can be Typical Urban or Rayleigh. The Rayleigh channel is typically used when the mobile station is in a rural area.

In a system using the GSM standard, a typical velocity of a mobile station using a Rayleigh channel is between 110 and 250 kilometers per hour (km/h). This corresponds to mobile station in an automobile traveling on a highway or in a fast train. When the number of obstacles in the rural area increases, the disturbing factor of the Rayleigh fading increases, and the Typical Urban channel is used instead of the Rayleigh channel. A typical velocity for a mobile station using the Typical Urban channel is between 3 and 50 km/h. This corresponds to a mobile station used by a person walking in an urban area or in an automobile traveling on a city street, respectively.

In a system using the CTS standard, the velocity of the mobile station is typically assumed to be 3 km/h for both Rayleigh and Typical Urban channels. This corresponds to a mobile station moving in a rural area with the velocity of 3 km/h.

The statistical uncertainties of the simulation results were reduced by running one thousand simulations. The possibility of detecting the transmitted FCB from the base station (alarm) and the possibility of falsely detecting another signal as the FCB (false alarm) were studied. The results are very similar for both channels at different velocities. Therefore, only one case is presented here. The Typical Urban channel with the user velocity at 3 km/h was chosen since it represents a difficult scenario.

FIGS. 8A–8F and FIGS. 9A–9F illustrate detection error probabilities using the cross-correlation technique according to an exemplary embodiment of the present invention, a conventional detection technique, and a modified version of the conventional detection technique at various detection thresholds. FIGS. 8A–8F show detection error probabilities for a system employing the GSM standard, and FIGS. 9A–9F show detection error probabilities for a system employing the CTS standard. The solid, dashed, and dash-dotted curves from left to right in each figure represent the detection probabilities using the detection technique according to the present invention, the conventional detection technique, and the modified conventional detection technique, respectively. For each set of curves corresponding to a particular detection technique, the left-most subset of curves represents the probability of proper detection, and the right-most subset of curves represents probability of improper detection. Three curves for each subset of curves represent, from top to bottom, the SNRs of 3, 7.5, and 11 dB, respectively.

As can be seen from FIGS. 8A–8F and FIGS. 9A–9F, improper and proper detection curves for the technique according to the present invention (solid curves) and the modified conventional technique (dash-dotted curves) have intersection points at lower probability values than the corresponding curves for the unmodified conventional technique (dashed curves). This means that improper detection and proper detection are better distinguished when using the detection technique according to the present invention or the modified conventional technique as compared to the unmodified conventional detection technique. In addition, the curves of the detection technique according to the present invention are more separated from each other than those of the modified conventional technique. This makes it easy to select a detection threshold.

The performance of the technique according to the present invention and the performance of the modified conventional technique deteriorate with higher frequency offset. Comparing FIGS. 8A–8F with FIGS. 9A–9F, this deterioration is more prevalent in a system employing the GSM standard than a system employing the CTS standard. This is due to the bandwidth of the frequency selective filter, which is 13.5 KHz and 27 KHz for GSM and CTS, respectively.

From FIGS. 8A–9F, it is evident that the lower the detection threshold, the greater the probability of improper detection. Thus, using curves such as those shown in these figures, the detection threshold can be adjusted such that the probability of improper detection is at a desirably low level.

According to the present invention, a method and apparatus are provided for detecting a frequency synchronization signal by estimating a cross-correlation value. The cross-correlation value is estimated by computing the product of the quadrature component and the delayed in-phase component for a predetermined number of samples of a received signal and smoothing the products. Memory requirements can be minimized by using exponential averaging for smoothing. The received signal can be prefiltered to improve detection. All the smoothing, multiplying, filtering, etc. represented in the equations above can be performed, for example, in an ASIC chip.

Although described in an application to a GSM and a CTS system, it will be appreciated by those of ordinary skill in the art that this invention can be embodied in other specific forms without departing from its essential character. For example, the invention is applicable to other mobile communication systems, e.g., systems employing the Digital Cellular System (DCS) standard or the Personal Communication Services (PCS) standard, or any system in which there is a need to detect a frequency synchronization signal. The embodiments described above should therefore be considered in all respects to be illustrative and not restrictive.

We claim:

1. In a communication system including at least one transmitter and at least one receiver, a method for detecting a frequency synchronization signal transmitted from the transmitter to the receiver along with other signals, said signals including in-phase and quadrature components, the method comprising the steps of:

delaying the in-phase component of a received signal;

computing products of the in-phase component and the quadrature component for a predetermined number of samples of the received signals;

smoothing the products of the delayed in-phase component and the quadrature component to produce an estimated cross-correlation value;

determining whether the estimated cross-correlation value is at least as great as a predetermined threshold, indicating that the transmitted signal is a frequency synchronization signal.

2. The method of claim 1, wherein the step of smoothing comprises averaging the products over the predetermined number of samples of the received signal.

3. The method of claim 1, further comprising a step of normalizing the in-phase and quadrature components.

4. The method of claim 1, further comprising a step of filtering the in-phase and quadrature components to remove surrounding noise.

5. The method of claim 1, wherein the predetermined number of samples corresponds to the length of the frequency synchronization signal.

6. The method of claim 1, wherein the predetermined number of samples corresponds to an approximate length of the frequency synchronization signal.

7. The method of claim 1, further comprising a step of:

if the signal is a frequency synchronization signal, determining a frequency offset between a local frequency reference of the receiver and a carrier frequency of the transmitter based on the estimated cross-correlation value.

8. In a communication system including at least transmitter and at least one receiver, an apparatus for detecting a frequency synchronization signal transmitted from the transmitter to the receiver along with other signals, said signals including in-phase and quadrature components, the apparatus comprising:

a delay element for delaying the in-phase component of the received signal;

a multiplier for forming a product of the delayed in-phase component and the quadrature component for a predetermined number of samples of the received signal;

a circuit for smoothing the products to produce an estimated cross-correlation value;

a determining circuit for determining whether the estimated cross-correlation value is at least as great as a predetermined threshold, indicating that the transmitted signal is a frequency synchronization signal.

9. The apparatus of claim 8, wherein the smoothing circuit averages the product over a predetermined number of samples of the received signal.

10. The apparatus of claim 8, further comprising a normalizer for normalizing the in-phase and quadrature components.

11. The apparatus of claim 8, further comprising a filter for eliminating surrounding noise in the in-phase and quadrature components.

12. The apparatus of claim 8, wherein the predetermined number of samples corresponds to the length of the frequency synchronization signal.

13. The method of claim 8, wherein the predetermined number of samples corresponds to an approximate length of the frequency synchronization signal.

14. The apparatus of claim 8, further comprising a frequency estimation circuit for determining the frequency offset between a carrier frequency of the transmitter and a local frequency reference of the receiver, if the transmitted signal is a frequency synchronization signal, based on the estimated cross-correlation value.

* * * * *